(12) United States Patent
Ellinger et al.

(10) Patent No.: US 9,627,646 B2
(45) Date of Patent: Apr. 18, 2017

(54) METHOD FOR ENCAPSULATING AN ELECTRONIC ARRANGEMENT

(75) Inventors: Jan Ellinger, Hamburg (DE); Thorsten Krawinkel, Hamburg (DE); Klaus Keite-Telgenbüscher, Hamburg (DE); Anja Staiger, Hamburg (DE)

(73) Assignee: tesa SE, Norderstedt (DE)

( * ) Notice: Subject to any disclaimer, the term of this patent is extended or adjusted under 35 U.S.C. 154(b) by 283 days.

(21) Appl. No.: 12/549,767

(22) Filed: Aug. 28, 2009

(65) Prior Publication Data

US 2010/0068514 A1 Mar. 18, 2010

(30) Foreign Application Priority Data

Sep. 18, 2008 (DE) .................. 10 2008 047 964

(51) Int. Cl.
  *B32B 37/12* (2006.01)
  *H01L 51/52* (2006.01)
  *C09J 153/02* (2006.01)

(52) U.S. Cl.
  CPC ........ *H01L 51/5246* (2013.01); *C09J 153/02* (2013.01); *C09J 153/025* (2013.01); *Y10T 428/2835* (2015.01)

(58) Field of Classification Search
  USPC .................. 264/271.1, 272.11, 272.17
  See application file for complete search history.

(56) References Cited

U.S. PATENT DOCUMENTS

| | | | |
|---|---|---|---|
| 3,676,202 A * | 7/1972 | Korpman | 428/355 BL |
| 4,010,140 A | 3/1977 | Bullard et al. | |
| 4,024,312 A * | 5/1977 | Korpman | 428/343 |
| 4,051,195 A | 9/1977 | McWhorter | |
| 4,125,665 A | 11/1978 | Bemmels et al. | |
| 4,552,604 A | 11/1985 | Green | |
| 4,985,499 A | 1/1991 | Nishikawa et al. | |
| 5,104,938 A | 4/1992 | Toyama et al. | |
| 5,705,571 A * | 1/1998 | Tsiang et al. | 525/338 |
| 6,294,270 B1 * | 9/2001 | Clough | 428/620 |
| 7,645,507 B2 | 1/2010 | Vermunicht et al. | |
| 2002/0188053 A1 | 12/2002 | Zang et al. | |
| 2004/0225025 A1 | 11/2004 | Sullivan et al. | |

(Continued)

FOREIGN PATENT DOCUMENTS

| CN | 1715355A A | 1/2006 |
|---|---|---|
| CN | 101133134 A | 2/2008 |

(Continued)

OTHER PUBLICATIONS

M.E. Gross, et al., "Ultrabarrier Protective Coatings for Atmospherically Sensitive Thin-Film Electronic Devices", Society of Vacuum Coaters, pp. 89-92, 2003.

(Continued)

*Primary Examiner* — Galen Hauth
(74) *Attorney, Agent, or Firm* — Norris McLaughlin & Marcus, P.A.

(57) ABSTRACT

The present invention relates to a method for encapsulating an electronic arrangement against permeants, in which a pressure-sensitive adhesive composition based on vinylaromatic block copolymers is provided, and in which the pressure-sensitive adhesive composition is applied onto and/or around the regions of the electronic arrangement which are to be encapsulated.

22 Claims, 2 Drawing Sheets

(56) References Cited

U.S. PATENT DOCUMENTS

| | | |
|---|---|---|
| 2005/0182150 A1 | 8/2005 | Bamborough et al. |
| 2005/0228096 A1 | 10/2005 | Kirsten et al. |
| 2005/0287363 A1 | 12/2005 | Ring et al. |
| 2005/0288436 A1 | 12/2005 | Ring et al. |
| 2005/0288437 A1 | 12/2005 | Ring et al. |
| 2006/0100299 A1* | 5/2006 | Malik et al. ............... 522/31 |
| 2007/0092722 A1 | 4/2007 | Vermunicht et al. |
| 2007/0135552 A1 | 6/2007 | Wrosch et al. |
| 2007/0137775 A1 | 6/2007 | Bargmann et al. |
| 2007/0270553 A1 | 11/2007 | Bohm et al. |
| 2008/0139734 A1 | 6/2008 | Nakashima et al. |
| 2008/0214717 A1 | 9/2008 | Yao et al. |
| 2008/0249236 A1 | 10/2008 | Nakashima et al. |
| 2008/0286571 A1 | 11/2008 | Ichimura et al. |
| 2009/0026934 A1* | 1/2009 | Fujita et al. ............... 313/504 |

FOREIGN PATENT DOCUMENTS

| | | |
|---|---|---|
| CN | 101313044 A | 11/2008 |
| DE | 102004031188 A1 | 1/2006 |
| DE | 102004031189 A1 | 1/2006 |
| EP | 1311559 B1 | 5/2003 |
| EP | 1 674 432 A1 | 6/2006 |
| EP | 1 743 928 A1 | 1/2007 |
| EP | 1857515 A2 | 11/2007 |
| EP | 1900771 A1 | 3/2008 |
| EP | 1975217 A2 | 10/2008 |
| JP | 2000080339 A | 3/2000 |
| JP | 2000219860 A | 8/2000 |
| JP | 2003209421 A | 7/2003 |
| JP | 2004022277 A | 1/2004 |
| JP | 2007503478 A | 2/2007 |
| JP | 2007523979 A | 8/2007 |
| JP | 2007297503 A | 11/2007 |
| JP | 2008115383 A | 5/2008 |
| JP | 2009520042 A | 5/2009 |
| JP | 2009127031 A | 6/2009 |
| JP | 2009149829 A | 7/2009 |
| TW | 200404858 A | 4/2004 |
| WO | 98/21287 A1 | 5/1998 |
| WO | 00/39189 A1 | 7/2000 |
| WO | 02/26908 A1 | 4/2002 |
| WO | 03/065470 A1 | 8/2003 |
| WO | 2006/095015 A1 | 9/2006 |
| WO | 2007/087281 A1 | 8/2007 |
| WO | WO 2007087281 A1 * | 8/2007 |

OTHER PUBLICATIONS

A.G. Erlat et al., "Ultra-high Barrier Coatings on Polymer Substances for Flexible Optoelectronics: Water Vapor Transport and Measurement Systems", 47th Annual Technical Conference Proceedings—Society of Vacuum Coaters, pp. 654-659, 2004.

P. Dufour, et al., Chemistry & Technology of UV & EB Formulation for Coatings, Inks & Paints, Markets and Curing Equipment, vol. 1, pp. 15-46, 1991.

English Translation of Taiwanese Office Action for related Taiwanese Patent Application No. 098131177 mailed Jan. 3, 2014.

English Translation of Taiwanese Office Action for related Taiwanese Patent Application No. 098131177 mailed Aug. 21, 2014.

English Translation of Japanese Office Action for related Japanese Patent Application No. 2009-215102 mailed Aug. 6, 2014.

English Translation of Japanese Office Action for related Japanese Patent Application No. 2009-215102 dated Dec. 18, 2014.

English Translation of Taiwanese Office Action for related Taiwanese Patent Application No. 098131177 mailed Jun. 15, 2015.

* cited by examiner

METHOD FOR ENCAPSULATING AN ELECTRONIC ARRANGEMENT

The present invention relates to a method for encapsulating an electronic arrangement in accordance with the preamble of Claim 1 and to the use of a pressure-sensitive adhesive composition for encapsulating an electronic arrangement in accordance with the preamble of Claim 5.

(Opto)electronic arrangements are being used more and more often in commercial products or are about to be introduced to the market. Such arrangements comprise inorganic or organic electronic structures, for example organic, organometallic or polymeric semiconductors or else combinations thereof. Depending on the desired application, these arrangements and products are embodied in rigid or flexible fashion, where there is an increasing demand for flexible arrangements. Such arrangements are produced for example by printing methods such as relief printing, intaglio printing, screen printing, planographic printing or else so-called "non impact printing" such as, for instance, thermal transfer printing, inkjet printing or digital printing. In many cases, however, use is also made of vacuum methods, such as e.g. chemical vapour deposition (CVD), physical vapour deposition (PVD), plasma-enhanced chemical or physical deposition methods (PECVD), sputtering, (plasma) etching or vapour deposition, wherein the patterning is generally effected by means of masks.

Examples that may be mentioned here of (opto)electronic applications that are already commercial applications or are interesting in terms of their market potential include electrophoretic or electrochromic structures or displays, organic or polymeric light-emitting diodes (OLEDs or PLEDs) in indication and display devices or as lighting, electroluminescent lamps, organic solar cells, preferably dye or polymer solar cells, inorganic solar cells, preferably thin-film solar cells, in particular based on silicon, germanium, copper, indium and selenium, organic field effect transistors, organic switching elements, organic optical amplifiers, organic laser diodes, organic or inorganic sensors or else organically or inorganically based RFID transponders.

What can be regarded as a technical challenge for realizing sufficient lifetime and function of (opto)electronic arrangements in the field of inorganic and/or organic (opto)electronics, but especially in the field of organic (opto)electronics, is protecting the components contained therein against permeants. Permeants can be a multiplicity of low-molecular-weight organic or inorganic compounds, in particular water vapour and oxygen.

A large number of (opto)electronic arrangements in the field of inorganic and/or organic (opto)electronics, especially when using organic raw materials, are sensitive both to water vapour and to oxygen, where the penetration of water vapour is rated as a fairly major problem for many arrangements. Protection by means of an encapsulation is necessary during the lifetime of the electronic arrangement, therefore, since otherwise the performance deteriorates over the application period. Thus, for example as a result of an oxidation of the constituents for instance in the case of light-emitting arrangements such as electroluminescent lamps (EL lamps) or organic light-emitting diodes (OLED) the luminosity, in the case of electrophoretic displays (EP displays) the contrast or in the case of solar cells the efficiency can decrease drastically within a very short time.

In the case of inorganic and/or organic (opto)electronics, in particular in the case of organic (opto)electronics, there is a particular need for flexible adhesive solutions that constitute a permeation barrier to permeants such as oxygen and/or water vapour. In addition, there are a large number of further requirements for such (opto)electronic arrangements. The flexible adhesive solutions are therefore intended not only to achieve a good adhesion between two substrates, but additionally to fulfil properties such as high shear strength and peel strength, chemical resistance, ageing resistance, high transparency, simple processability and also high flexibility and pliability.

One approach that is common according to the prior art is therefore to place the electronic arrangement between two substrates that are impermeable to water vapour and oxygen. Afterwards, sealing is then effected at the edges. For inflexible structures, glass or metal substrates are used, which offer a high permeation barrier but are very susceptible to mechanical loading. Furthermore, these substrates cause the entire arrangement to have a relatively large thickness. In the case of metal substrates, moreover, there is no transparency. For flexible arrangements, by contrast, use is made of planar substrates, such as transparent or non-transparent films, which can be embodied in multilayer fashion. Combinations of different polymers as well as inorganic or organic layers can be used in this case. The use of such planar substrates enables a flexible, extremely thin construction. In this case, a wide variety of substrates such as e.g. films, woven fabrics, nonwovens and papers or combinations thereof are possible for the various applications.

In order to achieve a best possible sealing, special barrier adhesive compositions are used. A good adhesive composition for the sealing of (opto)electronic components has a low permeability to oxygen and in particular to water vapour, has a sufficient adhesion on the arrangement and can flow well on the latter. A low adhesion on the arrangement reduces the barrier effect at the interface, thereby enabling oxygen and water vapour to enter independently of the properties of the adhesive composition. It is only if the contact between composition and substrate is continuous that the properties of the composition are the determining factor for the barrier effect of the adhesive composition.

In order to characterize the barrier effect, the oxygen transmission rate OTR and the water vapour transmission rate WVTR are usually specified. In this case, the respective rate indicates the area- and time-related flow of oxygen and water vapour through a film under specific conditions of temperature and partial pressure and, if appropriate, further measurement conditions such as relative air humidity. The lower these values, the better the suitability of the respective material for encapsulation. In this case, the specification of the permeation is not only based on the values for WVTR or OTR but also always includes a specification with regard to the average path length of the permeation, such as e.g. the thickness of the material, or a normalization to a specific path length.

The permeability P is a measure of how permeable a body is to gases and/or liquids. A low P value denotes a good barrier effect. The permeability P is a specific value for a defined material and a defined permeant under steady-state conditions for a specific permeation path length, partial pressure and temperature. The permeability P is the product of diffusion term D and solubility term S:

$$P = D*S$$

The solubility term S in the present case describes the affinity of the barrier adhesive composition for the permeant. In the case of water vapour, for example, a low value is achieved for S by hydrophobic materials. The diffusion term D is a measure of the mobility of the permeant in the barrier material and is directly dependent on properties such as the molecular mobility or the free volume. Relatively low values are often achieved for D in the case of highly crosslinked or highly crystalline materials. However, highly crystalline materials are generally less transparent and higher crosslinking leads to a lower flexibility. The permeability P usually rises with an increase in molecular mobility, for instance even if the temperature is increased or the glass transition point is exceeded.

Approaches for increasing the barrier effect of an adhesive composition have to take account in particular of the two parameters D and S with regard to the influence on the permeability of water vapour and oxygen. In addition to these chemical properties, effects of physical influences on the permeability also have to be considered, in particular the average permeation path length and interface properties (flowing behaviour of the adhesive composition, adhesion). The ideal barrier adhesive composition has low D values and S values in conjunction with very good adhesion on the substrate.

A low solubility term S is usually insufficient for achieving good barrier properties. One classic example of this is siloxane elastomers, in particular. The materials are extremely hydrophobic (small solubility term) but have a comparatively small barrier effect against water vapour and oxygen as a result of their freely rotatable Si—O bond (large diffusion term). A good balance between solubility term S and diffusion term D is necessary, therefore, for a good barrier effect.

To date, liquid adhesives and adhesives based on epoxides have primarily been used for this purpose (WO98/21287 A1; U.S. Pat. No. 4,051,195 A; U.S. Pat. No. 4,552,604 A). These have a small diffusion term D as a result of high crosslinking. Their main area of use is edge adhesive bondings of rigid arrangements, but also moderately flexible arrangements. Curing is effected thermally or by means of UV radiation. A whole-area adhesive bonding is virtually impossible on account of the shrinkage occurring as a result of the curing, since stresses occur between adhesive and substrate during curing, which stresses can in turn lead to delamination.

The use of said liquid adhesives entails a series of disadvantages. This is because low-molecular-weight constituents (VOC—volatile organic compound) can damage the sensitive electronic structures of the arrangement and hinder handling in production. The adhesive has to be applied to each individual constituent of the arrangement in a complicated manner. It is necessary to procure expensive dispensers and fixing devices in order to ensure accurate positioning. Moreover, the manner of application prevents a fast continuous process and the lamination step subsequently required can also make it more difficult to achieve a defined layer thickness and adhesive bonding width within narrow limits as a result of the low viscosity.

Furthermore, such highly crosslinked adhesives have only a low flexibility after curing. The use of thermally crosslinking systems is limited in the low temperature range or in two-component systems by the pot life, that is to say the processing time until gelation has taken place. In the high temperature range and in particular in the case of long reaction times, the sensitive (opto)electronic structures in turn limit the usability of such systems—the maximum temperatures that can be employed in the case of (opto) electronic structures are often around 60° C. since preliminary damage can already occur starting at this temperature. In particular flexible arrangements which contain organic electronics and are encapsulated with transparent polymer films or composites composed of polymer films and inorganic layers impose narrow limits here. This also applies to lamination steps under high pressure. In order to achieve an improved durability, what is advantageous here is dispensing with a thermally loading step and lamination under lower pressure.

As an alternative to the thermally curable liquid adhesives, radiation-curing adhesives are now also being used in many cases (US 2004/0225025 A1). The use of radiation-curing adhesives avoids a lengthy thermal loading of the electronic arrangement. However, the irradiation gives rise to a momentary heating of the arrangement at points, since in general a very high proportion of IR radiation is also emitted alongside a UV radiation. Further abovementioned disadvantages of liquid adhesives such as VOC, shrinkage, delamination and low flexibility are likewise retained. Problems can arise as a result of additional volatile constituents or disassociation products from the photoinitiators or sensitizers. In addition, the arrangement has to be transmissive to UV light.

Since constituents of organic electronics, in particular, and many of the polymers used are often sensitive to UV loading, relatively lengthy exterior use is not possible without further additional protective measures, for instance further covering films. The latter can only be applied after UV curing in the case of UV-curing adhesive systems, which additionally increases the manufacturing complexity and the thickness of the arrangement.

US 2006/0100299 A1 discloses a UV-curable pressure-sensitive adhesive tape for encapsulating an electronic arrangement. The pressure-sensitive adhesive tape comprises an adhesive composition based on a combination of a polymer having a softening point of greater than 60° C., a polymerizable epoxy resin having a softening point of less than 30° C. and a photoinitiator. The polymers can be polyurethane, polyisobutylene, polyacrylonitrile, polyvinylidene chloride, poly(meth)acrylate or polyester, but in particular an acrylate. Adhesive resins, plasticizers or fillers are furthermore contained.

Acrylate compositions have a very good resistance to UV radiation and various chemicals, but have very different bond strengths on different substrates. While the bond strength on polar substrates such as glass or metal is very high, the bond strength on non-polar substrates such as polyethylene or polypropylene, for example, is rather low. Here there is the risk of diffusion at the interface to a pronounced extent. Moreover, these compositions are highly polar, which fosters a diffusion of water vapour, in particular, despite subsequent crosslinking. This tendency is further amplified by the use of polymerizable epoxy resins.

The embodiment as a pressure-sensitive adhesive composition mentioned in US 2006/0100299 has the advantage of a simple application, but likewise suffers from possible dissociation products as a result of the photoinitiators contained, a necessary UV transmissivity of the construction and a reduction of the flexibility after curing. Moreover, owing to the small proportion of epoxy resins or other crosslinkers, which is necessary for maintaining the tack and in particular the cohesion, the crosslinking density that can be achieved is only very much lower than that which can be achieved by means of liquid adhesives.

Pressure-sensitive adhesive tapes generally require a certain time, sufficient pressure and a good balance between viscous fraction and elastic fraction owing to the relatively high-molecular-weight polymers in contrast to liquid adhesives for a good wetting and adhesion on the surface. The subsequent crosslinking of the adhesive compositions generally leads to a shrinkage of the composition. This can lead to a reduction of the adhesion at the interface and in turn increase the permeability.

WO 2007/087281 A1 discloses a transparent flexible pressure-sensitive adhesive tape based on polyisobutylene (PIB) for electronic applications, in particular OLED. Polyisobutylene having a molecular weight of more than 500 000 g/mol and a hydrogenated cyclic resin are used in this case. The use of a photopolymerizable resin and of a photoinitiator is optionally possible.

On account of their low polarity, adhesive compositions based on polyisobutylene have a good barrier against water vapour, but a relatively low cohesiveness even at high molecular weights, for which reason they often have a low shear strength at elevated temperatures. The fraction of low-molecular-weight constituents cannot be reduced arbitrarily since otherwise the adhesion is significantly reduced and the interface permeation increases. When using a high fraction of functional resins, which is necessary on account of the very low cohesion of the composition, the polarity of the composition is increased again and the solubility term is thus increased.

By contrast, a pressure-sensitive adhesive composition with pronounced crosslinking exhibits good cohesion, but the flow behaviour is impaired. The pressure-sensitive adhesive composition can adapt to the roughness of a substrate surface only to an insufficient extent, whereby the permeation at the interface is increased. Moreover, a pressure-sensitive adhesive composition with pronounced crosslinking can dissipate deformation energy, such as occurs under loading, only to a relatively small extent. The bond strength is reduced by both phenomena. By contrast, a slightly crosslinked pressure-sensitive adhesive composition can indeed readily flow on rough surfaces and dissipate deformation energy, such that the requirements made of adhesion can be met, but the pressure-sensitive adhesive composition withstands a loading only to an inadequate extent on account of a reduced cohesion.

The prior art additionally discloses a pressure-sensitive adhesive composition without barrier properties (WO 03/065470 A1), which is used as a transfer adhesive composition in an electronic construction. The adhesive composition contains a functional filler that reacts with oxygen or water vapour within the construction. A simple application of a scavenger within the construction is thus possible. For sealing the construction towards the outside, a further adhesive having low permeability is used.

An adhesive composition based on vinylaromatic block copolymers is known from the prior art, for example from U.S. Pat. No. 4,985,499 A1. Said document describes various advantageous formulations of the adhesive composition.

Furthermore, the barrier effect of block copolymers is known from the prior art (US 2002/0188053 A1). Polymers based thereon are used here for the sealing of electrophoretic displays in that after application they are coated with a sealing layer and thus fixed.

It is an object of the present invention to specify a method for encapsulating an electronic arrangement against permeants, in particular water vapour and oxygen, which can be carried out in a simple manner and by means of which at the same time a good encapsulation is obtained. Furthermore, the intention is to increase the lifetime of (opto)electronic arrangements by the use of a suitable, in particular flexible, adhesive composition.

The present invention solves the problem described above by means of a method in accordance with claim 1. Patent Claim 5 and 19 describe coordinate solutions. The respective dependent claims relate to preferred configurations and developments.

The present invention is firstly based on the insight that, despite the disadvantages described above, it is nevertheless possible to use a pressure-sensitive adhesive composition for encapsulating an electronic arrangement in the case of which the disadvantages described above with regard to pressure-sensitive adhesive compositions do not occur or occur only to a reduced extent. This is because it had been found that a pressure-sensitive adhesive composition based on vinylaromatic block copolymers is particularly suitable for encapsulating electronic arrangements. According to the invention, a pressure-sensitive adhesive composition based on vinylaromatic block copolymers is correspondingly provided and applied to the regions of the electronic arrangement that are to be encapsulated. Since the adhesive composition is a pressure-sensitive adhesive composition, application is particularly simple since there is no need to effect pre-fixing or the like. Depending on the configuration of the pressure-sensitive adhesive composition, subsequent treatment is no longer necessary either.

In the field of adhesives, pressure-sensitive adhesive compositions are distinguished in particular by their permanent tack and flexibility. A material having permanent tack has to have a suitable combination of adhesive and cohesive properties at every point in time. This characteristic distinguishes the pressure-sensitive adhesive compositions from reactive adhesives, for example, which afford hardly any cohesion in the unreacted state. For good adhesion properties it is necessary to adjust pressure-sensitive adhesive compositions such that there is an optimum balance between adhesive and cohesive properties.

In the present case, encapsulation denotes not only an all-encompassing enclosure with said pressure-sensitive adhesive composition but also even a regional application of the pressure-sensitive adhesive composition on the regions of the (opto)electronic arrangement that are to be encapsulated, for example a covering on one side or a framing of an electronic structure.

By virtue of the selection of the constituents of the pressure-sensitive adhesive composition and the resultant low polarity resulting from a non-polar block of the vinylaromatic block copolymer and the resultant low solubility term (S) of the diffusion coefficient, a low permeation capability of permeants such as water vapour and oxygen, but in particular of water vapour, is achieved. Owing to the formation of at least two domains within the block copolymer, in addition a very good cohesion and at the same time improved barrier properties are obtained. By means of further components, as described below, depending on the requirements of the (opto)electronic arrangement, it is possible, for instance by means of a crosslinking reaction, for the properties to be advantageously adapted to the requirements.

The advantage of this present invention, then, in comparison with other pressure-sensitive adhesive compositions, is the combination of very good barrier properties with respect to oxygen and primarily with respect to water vapour in conjunction with good interface adhesion on different substrates, good cohesive properties and, in comparison with liquid adhesives, a very high flexibility and simple application in the (opto)electronic arrangement and during/in the encapsulation. Depending on the embodiment of the pressure-sensitive adhesive composition, adhesive compositions based on vinylaromatic block copolymers afford a good resistance to chemicals and ambient influences. Furthermore, specific embodiments also comprise transparent adhesive compositions, which can be employed especially for use in (opto)electronic arrangements since a reduction of incident or emerging light is kept very small.

The pressure-sensitive adhesive composition based on vinylaromatic block copolymers is therefore distinguished not only by good processability and coatability but also by good product properties with regard to adhesion and cohesion and by a good barrier effect with respect to oxygen and a very good barrier effect with respect to water vapour, in particular in comparison with pressure-sensitive adhesive compositions based on acrylates, silicones, or vinylacetate. Such a pressure-sensitive adhesive composition can be integrated in a simple manner into an electronic arrangement, in particular also into such an arrangement requiring high flexibility. Further particularly advantageous properties of the pressure-sensitive adhesive composition are similarly good adhesion on different substrates, high shear strength and high flexibility. Moreover, a low interface permeation is also obtained as a result of a very good adhesion to the substrate. Advantageous arrangements that combine the abovementioned advantages and thereby accelerate and simplify the encapsulation process are obtained by the use of the formulations described here for the encapsulation of (opto) electronic structures.

Since, in specific embodiments of the pressure-sensitive adhesive composition, no further thermal process steps or irradiation are/is necessary, no shrinkage occurs as a result of a crosslinking reaction and the pressure-sensitive adhesive composition is present as a web-type material or in a form correspondingly adapted to the electronic arrangement, it is the case that the composition can be integrated into the process for the encapsulation of the (opto)electronic construction simply and rapidly under low pressure. The disadvantages usually associated with the processing steps avoided, such as thermal and mechanical loadings, can thus be minimized. An encapsulation by lamination of at least parts of the (opto)electronic structures with a planar barrier material (e.g. glass, in particular thin glass, metal-oxide-coated films, metal films, multilayer substrate materials) is possible with a very good barrier effect in a simple role-to-role process. The flexibility of the entire construction depends, besides the flexibility of the pressure-sensitive adhesive composition, on further factors, such as geometry and thickness of the (opto)electronic structures or the planar barrier materials. The high flexibility of the pressure-sensitive adhesive composition makes it possible, however, to realize very thin, pliable and flexible (opto)electronic structures. The term "pliable" used should be understood to mean the property that the curvature of a curved object such as a drum with a specific radius, in particular with a radius of 1 mm, is followed without damage.

In a preferred configuration of a method for encapsulating an electronic arrangement against permeants, the pressure-sensitive adhesive composition can be provided in the form of an adhesive tape. This type of presentation permits a particularly simple and uniform application of the pressure-sensitive adhesive composition.

In this case, in one embodiment, the general expression "adhesive tape" encompasses a carrier material provided with a pressure-sensitive adhesive composition on one or both sides. The carrier material encompasses all planar structures, for example two-dimensionally extended films or film sections, tapes having an extended length and limited width, tape sections, diecuts, multilayer arrangements and the like. In this case, for different applications it is possible to combine a wide variety of carriers such as e.g. films, woven fabrics, nonwovens and papers with the adhesive compositions. Furthermore, the expression "adhesive tape" also encompasses so-called "transfer adhesive tapes", that is to say an adhesive tape without a carrier. In the case of a transfer adhesive tape, rather, the adhesive composition is applied prior to application between flexible liners that are provided with a release layer and/or have anti-adhesive properties. Application regularly involves firstly removing one liner, applying the adhesive composition and then removing the second liner. The pressure-sensitive adhesive composition can thus be used directly for connecting two surfaces in (opto)electronic arrangements.

In the present case, polymer films, film composites or films or film composites provided with organic and/or inorganic layers are preferably used as the carrier material of an adhesive tape. Such films/film composites can comprise all conventional plastics used for film production, and the following shall be mentioned by way of example but not restrictively:
polyethylene, polypropylene—in particular oriented polypropylene (OPP) produced by mono- or biaxial stretching, cyclic olefin copolymers (COC), polyvinyl chloride (PVC), polyester—in particular polyethylene terephthalate (PET) and polyethylene napthalate (PEN), ethylene vinyl alcohol (EVOH), polyvinylidene chloride (PVDC), polyvinylidene fluoride (PVDF), polyacrylonitrile (PAN), polycarbonate (PC), polyamide (PA), polyether sulphone (PES) or polyamide (PI).

The carrier can additionally be combined with organic or inorganic coatings or layers. This can be done by means of customary methods such as e.g. lacquering, printing, vapour deposition, sputtering, coextrusion or lamination. By way of example, but not restrictively, mention shall be made here for instance of oxides or nitrides of silicon and of aluminium, indium tin oxide (ITO) or sol-gel coatings.

Particularly, preferably, said films, in particular the polymer films, are transparent and/or provided with a permeation barrier for oxygen and water vapour, wherein the permeation barrier exceeds the requirements for the packaging sector (WVTR<$10^{-1}$ g/(m$^2$d); OTR<$10^{-1}$ cm$^3$/(m$^2$d bar)). The permeability for oxygen (OTR) and water vapour (WVTR) is determined according to DIN 53380 part 3 and ASTM F-1249, respectively. The oxygen permeability is measured at 23° C. and a relative humidity of 50%. The water vapour permeability is determined at 37.5° C. and a relative humidity of 90%. The results are normalized to a film thickness of 50 µm.

Depending on the requirements of the (opto)electronic arrangement, in one specific embodiment of the pressure-sensitive adhesive composition, the elastic and viscous properties and also the barrier effect can be varied by means of a (subsequent) crosslinking reaction. This can take place in a manner adapted to the (opto)electronic arrangement both thermally and by means of electromagnetic radiation, preferably UV radiation. The high flexibility of the pressure-sensitive adhesive composition is maintained in this case, however. More preferably, the crosslinking, if necessary, is effected before the application of the pressure-sensitive adhesive composition on the electronic arrangement. In this way a supply of energy possibly required for the crosslinking, for example in the form of heat or by means of UV irradiation or the like, cannot impair the electronic structures.

More preferably, a pressure-sensitive adhesive composition is used which, in specific embodiments, is transparent in the visible light of the spectrum (wavelength range of approximately 400 nm-800 nm). The desired transparency can be achieved in particular by using colourless tackifier resins. Such a pressure-sensitive adhesive composition is thus also suitable for a whole-area use over an (opto) electronic structure. A whole-area adhesive bonding affords the advantage over an edge sealing, in the case of an approximately central arrangement of the electronic structure, that the permeant would have to diffuse through the entire area before reaching the structure. The permeation distance is therefore significantly increased. The permeation distances lengthened in this embodiment in comparison with edge sealing by means of liquid adhesives, for instance, have a positive effect on the overall barrier since the permeation distance is inversely proportional to the permeability.

In this case, "transparency" means an average transmission of the adhesive composition in the visible light range of at least 75%, preferably higher than 90%. In the case of the embodiment as a pressure-sensitive adhesive tape with carrier, the maximum transmission of the entire construction is additionally dependent on the type of carrier used and the type of construction.

The electronic structures of (opto)electronic arrangements are often susceptible to UV radiation. It has been found to be particularly advantageous, therefore, if the pressure-sensitive adhesive composition is additionally embodied in a UV-blocking fashion. In the present case, the term "UV-blocking" denotes an average transmittance of at most 20%, preferably of at most 10%, more preferably of at most 1%, in the corresponding wavelength range. In a preferred configuration, the pressure-sensitive adhesive composition is embodied in UV-blocking fashion in the wavelength range of 320 nm to 400 nm (UVA radiation), preferably in the wavelength range of 280 nm to 400 nm (UVA and UVB radiation), more preferably in the wavelength range of 190 nm to 400 nm (UVA, UVB and UVC radiation).

The UV-blocking effect of the pressure-sensitive adhesive composition can be achieved in particular by adding UV blockers or suitable fillers to the pressure-sensitive adhesive composition. Examples of suitable UV blockers include HALS (Hindert Armine Light Stabilizer) such as Tinuvin from Ciba or benzimidazole derivatives. Titanium dioxide, in particular, is suitable as a filler, and especially nanoscale titanium dioxide, since a transparency in the visible range can thereby be maintained.

In a further advantageous embodiment, the pressure-sensitive adhesive composition exhibits a very good resistance to weathering influences and UV light. This resistance can be achieved in particular by using hydrogenated elastomers and hydrogenated resins.

The adhesive compositions used are preferably those based on block copolymers containing polymer blocks predominantly formed by vinylaromatics (A blocks), preferably styrene, and those predominantly formed by polymerization of 1,3-dienes (B blocks), preferably butadiene, isoprene or a mixture of the two monomers. Said B blocks usually have a low polarity. Both homopolymer and copolymer blocks can preferably be used as B blocks.

The block copolymers resulting from the A and B blocks can contain identical or different B blocks which can be partially, selectively or fully hydrogenated. The block copolymers can have linear A-B-A structures. Block copolymers of radial configuration and also star-shaped and linear multiblock copolymers can likewise be used. A-B diblock copolymers can be present as further components. All of the aforementioned polymers can be used by themselves or in a mixture with one another.

Instead of the preferred polystyrene blocks, the vinylaromatics used can also be polymer blocks based on other homopolymers and copolymers containing aromatics (preferably C-8 to C-12 aromatics) having glass transition temperatures of more than 75° C., such as e.g. α-methylstyrene-containing aromatic blocks. Furthermore, identical or different A blocks can also be included.

It is also possible to use block copolymers containing, alongside the blocks A and B described above, at least one further block, such as e.g. A-B-C block copolymers.

It is also conceivable, but not part of the subject matter of the present invention, to use the abovementioned B block with A blocks having a different chemical nature, which exhibit a glass transition temperature above room temperature, such as polymethylmethacrylate, for example.

Vinylaromatic block copolymers are known commercially for example under the name Kraton from the company Kraton (Kraton D 1101 and 1102 as styrene-butadiene-styrene block copolymers, Kraton D 1107 or 1163 as styrene-isoprene-styrene block copolymers, or Kraton G 1652 as hydrogenated styrene-butadiene-styrene block copolymer), under the name Europrene from the company Polimeri Europa (styrene block copolymers with isoprene, butadiene or the hydrogenation products thereof) or under the name Septon from the company Kuraray (hydrogenated styrene-isoprene-styrene block copolymers). A-B-C vinylaromatic block copolymers are obtainable e.g. under the name SBM from the company Arkema.

In one advantageous embodiment, the block copolymers have a polyvinyl aromatic fraction of 10% by weight to 35% by weight.

In a further preferred configuration, the fraction of the vinylaromatic block copolymers in total relative to the entire pressure-sensitive adhesive composition is at least 20% by weight, preferably at least 30% by weight, more preferably at least 35% by weight. An excessively small fraction of vinylaromatic block copolymers has the consequence that the cohesion of the pressure-sensitive adhesive composition is relatively low. The maximum fraction of the vinylaromatic block copolymers in total relative to the entire pressure-sensitive adhesive composition is at most 80% by weight, preferably at most 65% by weight, especially preferably at most 60% by weight. An excessively high fraction of vinylaromatic block copolymers has the consequence, in turn, that the pressure-sensitive adhesive composition has hardly any pressure-sensitive adhesiveness.

In a configuration with further preference, the pressure-sensitive adhesive composition has, alongside the at least one vinylaromatic block copolymer, at least one tackifier resin in order to increase the adhesion in a desired manner. The tackifier resin should be compatible with the elastomer block of the block copolymers.

Examples of tackifiers which can be used in the pressure-sensitive adhesive composition include non-hydrogenated, partially hydrogenated or fully hydrogenated resins based on rosin and rosin derivatives, hydrogenated polymers of dicyclopentadiene, non-hydrogenated or partially, selectively or fully hydrogenated hydrocarbon resins based on C5, C5-C9 or C9 monomer streams, polyterpene resins based on α-pinene and/or β-pinene and/or δ-limonene, hydrogenated polymers of preferably pure C8 and C9 aromatics. Aforementioned tackifier resins can be used either alone or in a mixture. In this case, it is possible to use resins that are liquid and also resins that are solid at room temperature. In order to ensure a high ageing and UV stability, hydrogenated resins having a degree of hydrogenation of at least 90%, preferably at least 95%, are preferred.

Furthermore, non-polar resins having a DACP value (diacetone alcohol cloud point) above 30° C. and an MMAP value (mixed methylcylohexane aniline point) of greater than 50° C., in particular having a DACP value above 37° C. and an MMAP value greater than 60° C., are preferred. The DACP value and the MMAP value respectively specify the solubility in a specific solvent. A particularly high permeation barrier, in particular against water vapour, is achieved through the selection of these ranges.

Further preference is given to resins having a softening point (ring/ball) of more than 95° C., in particular more than 100° C. A particularly high permeation barrier, in particular against oxygen is achieved by this selection.

Further additives which can be used typically include:
plasticizers such as, for example, plasticizer oils or low-molecular-weight liquid polymers, such as low-molecular-weight polybutenes, for example
primary antioxidants such as sterically hindered phenols, for example
secondary antioxidants such as phosphites or thioethers, for example,
process stabilizers such as C-radical scavengers, for example
light stabilizers such as UV absorbers or sterically hindered amines, for example
processing assistants
end block reinforcer resins, and
if appropriate further polymers preferably elastomeric in nature; elastomers that can correspondingly be used include, inter alia, those based on pure hydrocarbons, for example unsaturated polydienes such as natural or synthetically produced polyisoprene or polybutadiene, chemically substantially saturated elastomers such as, for example, saturated ethylene-propylene copolymers, α-olefin copolymers, polyisobutylene, butyl rubber, ethylene-propylene rubber, and chemically functionalized hydrocarbons such as, for example, halogen-containing, acrylate-containing, allyl- or vinyl-ether-containing polyolefins.

In a further embodiment, the pressure-sensitive adhesive compositions used according to the invention are cross-linked preferably before or else, if appropriate, after flowing on the surface, those degrees of crosslinking which continue to enable a high flexibility and good adhesion of the material being striven for. After crosslinking, the pressure-sensitive adhesive composition preferably has an elongation at break of at least 20%. Such an elongation at break is particularly preferred with regard to a configuration of the pressure-sensitive adhesive composition which is as flexible as possible. The elongation at break is determined at an elongation rate of 300 mm/min and a temperature of 23° C.

In one preferred procedure, the pressure-sensitive adhesive composition is crosslinked using UV radiation or electron beams. A detailed description of the prior art and the most important method parameters with regard to the crosslinking are known to the person skilled in the art for example from "Chemistry and Technology of UV and EB formulation for Coatings, Inks and Paints" (Vol. 1, 1991, SITA, London). In addition, it is also possible to use other methods that enable high-energy irradiation.

In order to reduce the radiation dose required, it is possible to admix with the viscoelastic material crosslinkers and/or promoters for crosslinking, in particular crosslinkers and/or promoters that can be excited by UV, electron beams and/or thermally. Suitable crosslinkers for radiation crosslinking are monomers or polymers which comprise the following functional groups, for example: acrylate or methacrylate, epoxide, hydroxyl, carboxyl, vinyl, vinylether, oxetane, thiole, acetoacetate, isocyanates, allyl or generally unsaturated compounds. The monomers or polymers used can be di- or multifunctional depending on the requirements made of the degree of crosslinking.

In a further preferred design, the pressure-sensitive adhesive compositions are crosslinked using thermally activatable crosslinkers. For this purpose, peroxides, acids or acid anhydrides, metal chelates, bi- or multifunctional epoxides, bi- or multifunctional hydroxides and bi- or multifunctional isocyanates are preferably admixed, such as described for instance for acid anhydrides in EP 1311559 B1.

Besides the monomeric crosslinkers with the functional groups described, use is preferably made of vinylaromatic block copolymers that are functionalized with these cross-linking groups. Use is advantageously made of functionalized vinylaromatic block copolymers such as the Kraton FG series (for instance Kraton FG 1901 or Kraton FG 1924), Asahi Tuftec M 1913 or Tuftec M 1943 or Septon HG252 (SEEPS-OH). Further preferred block copolymers are obtainable for example under the name Epofriend A 1005, A 1010 or A 1020 from the company Daicel. By adding suitable crosslinking agents (for example polyfunctional isocyanates, amines, epoxides, alcohols, thiols, phenols, guanidines, mercaptanes, carboxylic acids or acid anhydrides), these block copolymers can be crosslinked thermally or by means of radiation. A combination of acid- or acid-anhydride-modified vinylaromatic block copolymer (for example Kraton FG series) and an epoxidized vinylaromatic block copolymer (for example Daicel Epofriend series) can also advantageously be used. It is thereby possible to realize a crosslinking without a monomeric cross-linker, as a result of which no monomeric constituents remain even in the event of incomplete crosslinking. A mixture of the functionalized monomers or polymers can likewise be used.

In one embodiment of the present invention, the pressure-sensitive adhesive composition also contains fillers; by way of example but not restrictively mention shall be made of oxides, hydroxides, carbonates, nitrides, halides, carbides or mixed oxide/hydroxide/halide compounds of aluminium, silicon, zirconium, titanium, tin, zinc, iron or alkali or alkaline earth metals. Aluminas, e.g. aluminium oxides, boehmite, bayerite, gibbsite, diaspore and the like, are essentially involved here. Phyllosilicates such as, for example, bentonite, montmorillonite, hydrotalcite, hectorite, kaolinite, boehmite, mica, vermiculite or mixtures thereof are especially suitable. However, carbon blacks or further modifications of carbon, for instance carbon nanotubes, can also be used.

Nanoscale and/or transparent fillers are preferably used as fillers of the pressure-sensitive adhesive composition. In the present case, a filler is referred to as nanoscale if it has a maximum extent of approximately 100 nm, preferably of approximately 10 nm, in at least one dimension. Particularly preferably, use is made of such fillers which are transparent in the composition and have a platelet-shaped crystallite structure and a high aspect ratio with homogenous distribution. The fillers having a platelet-like crystallite structure and aspect ratios of far greater than 100 generally have only a thickness of a few nm; however, the length or width of the crystallites can be up to a few μm. Such fillers are likewise referred to as nanoparticles. The particulate configuration of the fillers with small dimensions is particularly advantageous, moreover, for a transparent design of the pressure-sensitive adhesive composition.

By constructing labyrinthine structures with the aid of the above-described fillers in the adhesive matrix, the diffusion distance of oxygen and water vapour, for example, is lengthened in such a way that the permeation thereof through the adhesive layer is reduced. For better dispersibility of these fillers in the binder matrix, these fillers can be superficially modified with organic compounds. The use of such fillers per se is known for example from US 2007/0135552 A1 and WO 02/026908 A1.

In a further advantageous embodiment of the present invention, fillers which can interact with oxygen and/or water vapour in a particular way are also used. Oxygen or water vapour penetrating into the (opto)electronic arrangement is then chemically or physically bound to said fillers. Said fillers are also referred to as "getter", "scavenger", "desiccant" or "absorber". Such fillers comprise by way of example, but not restrictively: oxidizable metals, halides, salts, silicates, oxides, hydroxides, sulphates, sulphites, carbonates of metals and transition metals, perchlorates and activated carbon, including its modifications. Examples are cobalt chloride, calcium chloride, calcium bromide, lithium chloride, zinc chloride, zinc bromide, silicon dioxide (silica gel) aluminium oxide (activated aluminium), calcium phosphate, copper sulphate, sodium dithionite, sodium carbonate, magnesium carbonate, titanium dioxide, bentonite, montmorillonite, diatomaceous earth, zeolites and oxides of alkali or alkaline earth metals such as barium oxide, calcium oxide, iron oxide and magnesium oxide or else carbon nanotubes. Furthermore, it is also possible to use organic absorbers, for example polyolefin copolymers, polyamide copolymers, PET copolyesters or further hybrid-polymer-based absorbers, which are usually used in combination with catalysts such as cobalt, for example. Further organic absorbers are, for instance, weakly crosslinked polyacrylic acid, ascorbates, glucose, gallic acid or unsaturated fats and oils.

In order to obtain a best possible efficacy of the fillers with regard to the barrier effect, their fraction should not be too low. The fraction is preferably at least 5% by weight, more preferably at least 10% by weight, and especially preferably at least 15% by weight. A highest possible fraction of fillers is typically used, without the bond strengths of the pressure-sensitive adhesive composition being reduced to an excessively great extent or without further properties being impaired in the process. In one design, therefore, the fraction is at most 95% by weight, preferably at most 70% by weight, more preferably at most 50% by weight.

Furthermore, a finest possible distribution and highest possible surface area of the fillers are advantageous. This enables a higher efficiency and a higher loading capacity and is achieved in particular by means of nanoscale fillers.

The pressure-sensitive adhesive composition can be produced and processed from solution, dispersion and from the melt. Production and processing are preferably effected from solution or from the melt. The manufacture of the adhesive composition from solution is particularly preferred. In this case, the constituents of the pressure-sensitive adhesive composition are dissolved in a suitable solvent, for example toluene or mixtures of petroleum spirit and acetone, and applied to the carrier by generally known methods. In the case of processing from the melt, these application methods can be by means of a nozzle or a calender. In the case of methods from solution, coatings by means of doctor blades, knives, rollers or nozzles are known, to name just a few.

The pressure-sensitive adhesive composition can either be used for the whole-area adhesive bonding of (opto)electronic arrangements or after corresponding converting it is possible to produce diecuts, rolls or other shaped bodies from the pressure-sensitive adhesive composition or the pressure-sensitive adhesive tape. Corresponding diecuts and shaped bodies of the pressure-sensitive adhesive composition/pressure-sensitive adhesive tape are then preferably adhesively bonded onto the substrate to be adhesively bonded, for instance as borders or delimitation of an (opto) electronic arrangement. The choice of the shape of the die cut or of the shaped body is not restricted and is chosen depending on the type of (opto)electronic arrangement. The possibility of planar lamination is advantageous, in comparison with liquid adhesives as a result of the increase in the permeation path length as a result of lateral penetration of the permeants, for the barrier properties of the composition since a permeation path length inversely proportionally affects the permeation.

If the pressure-sensitive adhesive composition is provided in the form of a planar structure with a carrier, it is preferred for the thickness of the carrier to be preferably in the range of approximately 1 µm to approximately 350 µm, more preferably between approximately 4 µm and approximately 250 µm, and particularly preferably between approximately 12 µm and approximately 150 µm. The optimum thickness depends on the (opto)electronic arrangement, the final application and the type of embodiment of the pressure-sensitive adhesive composition.

Further details, aims, features and advantages of the present invention are explained more comprehensively below on the basis of preferred exemplary embodiments. In the drawing.

Figure 1:
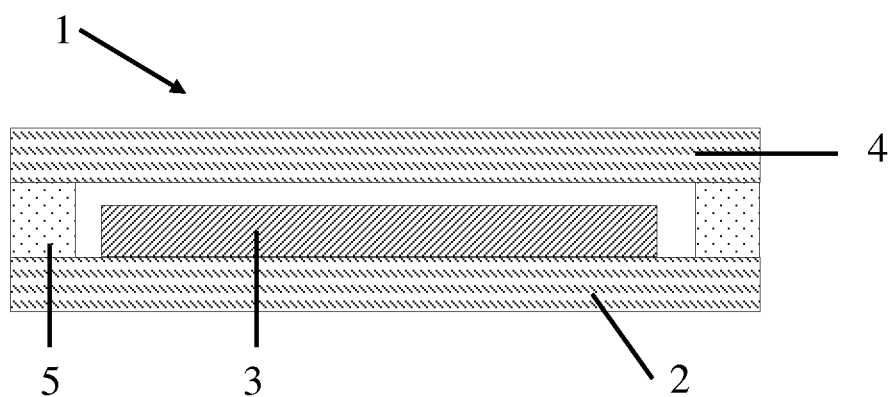
FIG. 1 shows a first (opto)electronic arrangement in schematic illustration.

FIG. 1 shows a first configuration of an (opto)electronic arrangement 1. This arrangement 1 has a substrate 2, on which an electronic structure 3 is arranged. The substrate 2 itself is embodied as a barrier to permeants and thus forms part of the encapsulation of the electronic structure 3. A further covering 4, embodied as a barrier, is arranged above the electronic structure 3, and in the present case also spatially at a distance therefrom.

In order also to encapsulate the electronic structure 3 towards the side and moreover at the same time to connect a covering 4 to the electronic arrangement 1, a pressure-sensitive adhesive composition 5 is provided circumferentially alongside the electronic structure 3 on the substrate 2. The pressure-sensitive adhesive composition 5 connects the covering 4 to the substrate 2. By means of an appropriately thick configuration, the pressure-sensitive adhesive composition 5 additionally enables the covering 4 to be spaced apart from the electronic structure 3.

The pressure-sensitive adhesive composition 5 is one based on vinylaromatic block copolymers such as was described in general form above and is set out in greater detail in exemplary embodiments below. In the present case, the pressure-sensitive adhesive composition 5 not only performs the function of connecting the substrate 2 to the covering 4 but also additionally forms a barrier layer for permeants, in order thus to encapsulate the electronic structure 2 against permeants such as water vapour and oxygen from the side as well.

In the present case, the pressure-sensitive adhesive composition 5 is additionally provided in the form of a die cut from a double-sided adhesive tape. Such a die cut enables particularly simple application.

Figure 2:
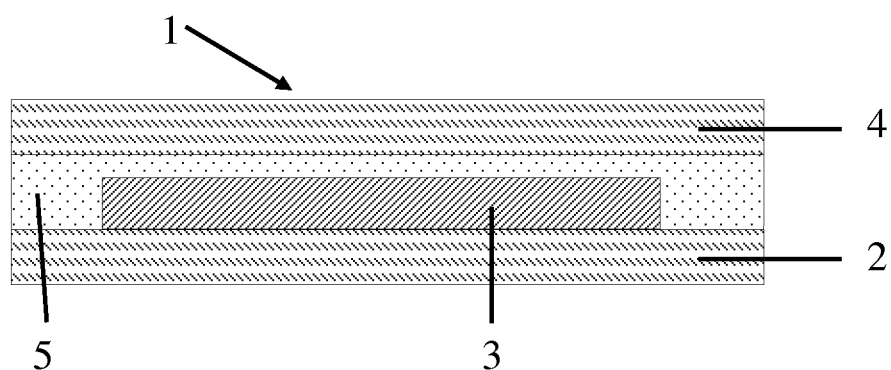
FIG. 2 shows a second (opto)electronic arrangement in schematic illustration.

FIG. 2 shows an alternative configuration of an (opto) electronic arrangement 1. Once again an electronic structure 3 is shown which is arranged on a substrate 2 and is encapsulated from below by the substrate 2. The pressure-sensitive adhesive composition 5 is now arranged over the whole area above and to the sides of the electronic structure. The electronic structure 3 is thus encapsulated by the pressure-sensitive adhesive composition 5 at these locations. A covering 4 is then applied to the pressure-sensitive adhesive composition 5. In contrast to the previous configuration, said covering 4 does not necessarily have to meet the stringent barrier requirements, since the barrier is already provided by the pressure-sensitive adhesive composition. The covering 4 can for example just perform a mechanical protective function; however, it can also additionally be provided as a permeation barrier.

Figure 3:
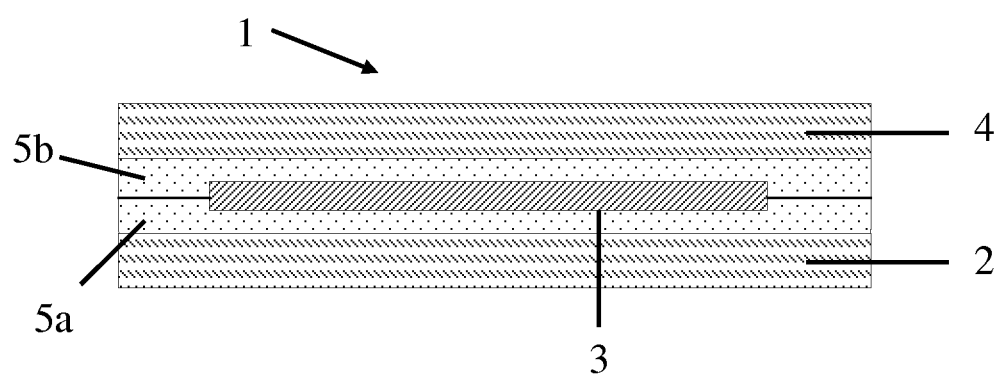
FIG. 3 shows a third (opto)electronic arrangement in schematic illustration.

FIG. 3 shows a further alternative configuration of an (opto)electronic arrangement 1. In contrast to the previous configurations, two pressure-sensitive adhesive compositions 5a, b are now provided, which are embodied identically in the present case. The first pressure-sensitive adhesive composition 5a is arranged over the whole area on the substrate 2. The electronic structure 3 is then provided on the pressure-sensitive adhesive composition 5a, said electronic structure being fixed by the pressure-sensitive adhesive composition 5a. The composite comprising pressure-sensitive adhesive composition 5a and electronic structure 3 is then covered over the whole area by the further pressure-sensitive adhesive composition 5b, with the result that the electronic structure 3 is encapsulated from all sides by the pressure-sensitive adhesive compositions 5a, b. The covering 4 is then once again provided above the pressure-sensitive adhesive composition 5b.

In this configuration, therefore, neither the substrate 2 nor the covering 4 necessarily has to have barrier properties. However, they can nevertheless be provided, in order to further restrict the permeation of permeants to the electronic structure 3.

With regard to FIGS. 2, 3, in particular, it is pointed out that the illustrations are schematic illustrations in the present case. It is not evident from the illustrations that the pressure-sensitive adhesive composition 5 is in each case applied with a homogenous layer thickness. At the transition to the electronic structure, therefore, a sharp edge such as there appears to be in the illustration is not formed, rather the transition is fluid and it is possible, rather, for small unfilled or gas-filled regions to remain. If appropriate, however, adaptation to the substrate can also be effected, particularly when the application is carried out under vacuum. Moreover, the pressure-sensitive adhesive composition is compressed to different extents locally, with the result that a certain compensation of the height difference at the edge structures can be effected as a result of flow processes. Moreover, the dimensions shown are not to scale, but rather serve only for better illustration. In particular the electronic structure itself is generally embodied in relatively flat fashion (often less than 1 µm thick).

In all the exemplary embodiments shown, the pressure-sensitive adhesive composition 5 is applied in the form of a pressure-sensitive adhesive tape. This can be, in principle, a double-sided pressure-sensitive adhesive tape with a carrier, or a transfer adhesive tape. A configuration of a transfer adhesive tape is chosen in the present case.

The thickness of the pressure-sensitive adhesive composition, which is present either as a transfer adhesive tape or in a manner coated on a planar structure, is preferably between approximately 1 µm and approximately 150 µm, more preferably between approximately 5 µm and approximately 75 µm, and particularly preferably between approximately 12 µm and 50 µm. In the preferred thickness ranges there is a good compromise between a small composition thickness and the resultant small permeation cross section, which reduces the permeation, and a sufficiently thick composition film for producing a sufficiently adhesive connection. The optimum thickness depends on the (opto)electronic construction, the final application, the type of embodiment of the pressure-sensitive adhesive composition and, if appropriate, the planar substrate.

EXAMPLES

Unless indicated otherwise, all quantitative indications in the examples below are percentages by weight or parts by weight relative to the overall formulation.
Test Methods
Bond Strength The determination of the bond strength was carried out as follows: a steel surface, a polyethylene terephthalate (PET) plate and a polyethylene (PE) plate were used as the defined substrate. The bondable planar element under investigation was cut to a width of 20 mm and a length of approximately 25 cm, provided with a handling section, and immediately thereafter pressed onto the respectively selected substrate five times by means of a 4 kg steel roller at a speed of 10 m/min. Immediately after that, the previously bonded planar element was stripped from the substrate by means of a tensile testing instrument (Zwick) at an angle of 180° at room temperature and 300 mm/min, and the force required to achieve this was measured. The measurement value (in N/cm) resulted as the average value from three individual measurements.
Shear Adhesion Failure Temperature (SAFT)

The determination of the SAFT was carried out as follows: a polished steel surface was used as the defined substrate. The bondable planar element under investigation was cut to a width of 10 mm and a length of approximately 5 cm, and immediately thereafter pressed onto the respectively selected substrate having an area of 10×13 mm three times by means of 2 kg steel roller at a speed of 10 m/min. Immediately after that, the previously bonded planar element was loaded with 0.5 N at an angle of 180° and a temperature ramp of 9° C./min was implemented. The temperature at which the sample covered a slip distance of 1 mm was measured in this case. The measurement value (in ° C.) results as the average value from two individual measurements.
Transmission The transmission of the adhesive composition was determined over the VIS spectrum. The recordings of the VIS spectrum were carried on a UVIKON 923 from Kontron. The wavelength range of the measured spectrum encompasses all frequencies between 800 nm and 400 nm at a resolution of 1 nm. For this purpose, the adhesive composition was applied to a PET carrier and the measurement was preceded by an idle channel measurement of the carrier as a reference over the entire wavelength range. The result was specified by averaging the transmission measurements in the specified range.
Permeation The permeability for oxygen (OTR) and water vapour (WVTR) was determined according to DIN 53380 part 3 and ASTM F-1249, respectively. For this purpose, the pressure-sensitive adhesive composition was applied with a layer thickness of 50 µm to a permeable membrane. For the oxygen permeability, measurement was effected at 23° C.

and a relative humidity of 50%. The water vapour permeability was determined at 37.5° C. and a relative humidity of 90%.

Bending Test

For determining the flexibility, the adhesive composition was coated in a layer thickness of 50 μm between two 23 μm PET carriers and tested to a bending radius of 1 mm during bending of 180°. The test is passed if the layer does not break or become detached.

Lifetime Test

A calcium test was used as a measure of the determination of the lifetime of an (opto)electronic construction. For this purpose, under a nitrogen atmosphere a thin calcium layer with a size of 20×20 mm$^2$ is deposited onto a glass plate. The thickness of the calcium layer is approximately 100 nm. The calcium layer is encapsulated using an adhesive tape with a PET barrier film as carrier material (WVTR=8×10$^{-2}$ g/m$^2$*d and OTR=6×10$^{-2}$ cm$^3$/m$^2$·d·bar, in accordance with conditions mentioned according to ASTM F-1249 and DIN 53380 part 3 and above). The adhesive tape is applied with an all-round edge of 5 mm above the calcium level at which it adheres directly on the glass plate.

The test is based on the reaction of calcium with water vapour and oxygen as described for example by A. G. Erlat et. al. in "47th Annual Technical Conference Proceedings—Society of Vacuum Coaters", 2004, pages 654-659, and by M. E. Gross et al. in "46th Annual Technical Conference Proceedings—Society of Vacuum Coaters", 2003, pages 89-92. In this case, the light transmission of the calcium layer is monitored, which increases as a result of the conversion into calcium hydroxide and calcium oxide. The attainment of 90% of the transmission of the construction without a calcium layer is designated as the end of the lifetime. 23° C. and 50% relative air humidity are chosen as measurement conditions. The specimens were adhesively bonded over the whole area and without any bubbles with a layer thickness of the pressure-sensitive adhesive composition of 25 μm.

Production of the Specimens

The pressure-sensitive adhesive compositions in examples 1 to 4 were prepared from solution. This was done by dissolving the individual constituents in toluene (solids fraction 40%) and coating out the solution onto an untreated PET film, with drying at 120° C. for 15 minutes, in such a way as to produce a layer of adhesive composition having a weight per unit area of 50 g/m$^2$. For the permeation test, specimens were produced in the same way, but the solution was coated out not onto a PET film but rather onto a release paper siliconized with 1.5 g/m$^2$, with the result that after transfer to the permeable membrane, it was possible to perform a measurement on the pure pressure-sensitive adhesive composition.

Example 1

| | | |
|---|---|---|
| 100 parts | Vector 4113 | SIS with 15% block polystyrene content from Dexco. The SIS contained approximately 20% diblock content. |
| 100 parts | Escorez 5600 | Hydrogenated HC resin (hydrocarbon resin) with a softening point of 100° C., from Exxon |
| 25 parts | Ondina G 17 | White oil comprising 66% paraffinic and 34% naphthenic fractions, from Shell |

Example 2

| | | |
|---|---|---|
| 100 parts | Kraton G 1657 | SEBS with 13% block polystyrene content from Kraton. The SEBS contained approximately 36% diblock content. |
| 100 parts | Escorez 5600 | Hydrogenated HC resin with a softening point of 100° C., from Exxon. |
| 25 parts | Ondina G 17 | White oil comprising paraffinic and naphthenic fractions, from Shell |

Example 3

| | | |
|---|---|---|
| 100 parts | Tuftec P 1500 | SEBS with 30% block polystyrene content from Asahi. The SEBS contained approximately 68% diblock content. |
| 100 parts | Escorez 5600 | Hydrogenated HC resin with a softening point of 100° C., from Exxon. |
| 25 parts | Ondina G 17 | White oil comprising paraffinic and naphthenic fractions, from Shell |

Example 4

| | | |
|---|---|---|
| 70 parts | Tuftec P 1500 | SBBS with 30% block polystyrene content from Asahi. The SBBS contained approximately 68% diblock content. |
| 30 parts | Kraton G 1657 | SEBS with 13% block polystyrene content from Kraton. The SEBS contained approximately 36% diblock content. |

-continued

| 100 parts | Escorez 5600 | Hydrogenated HC resin with a softening point of 100° C., from Exxon |
| 25 parts | Ondina G 17 | White oil comprising paraffinic and naphthenic fractions, from Shell |

Comparative Example C1

An acrylate having the formulation 78% EHA, 19% stearyl acrylate and 3% acrylic acid was polymerized in acetone and petroleum spirit and coated from the solution onto an untreated PET carrier (or onto a release paper siliconized with 1.5 g/m² for the permeation measurements), dried at 120° C. for 15 min and crosslinked with 0.2% aluminium chelate relative to the acrylate fraction. The thickness of the adhesive layer is 50 µm.

Comparative Example C2

A mixture of 60% levamelt 456 (ethylene vinylacetate) and 40% foral 85 are dissolved in acetone and coated from the solution onto an untreated PET carrier (or onto a release paper siliconized with 1.5 g/m² for the permeation measurements) and dried at 120° C. for 15 min. The thickness of the adhesive layer is 50 µm.

Comparative Example C3

The commercially available silicone pressure-sensitive adhesive composition Silgrip PSA 529 from GE Bayer Silikons is mixed with benzoyl peroxide and coated from the solution onto an untreated PET carrier (or onto a release paper siliconized with 1.5 g/m² for the permeation measurements) and dried at 120° C. for 15 min and crosslinked. The thickness of the adhesive layer is 50 µm.

Comparative Example C4

A commercially available UV-curing epoxide from Epo-Tek OG142 was spread onto a PET film in a thickness of 50 µm and cured at 160 W/cm by means of a medium-pressure mercury vapour lamp at a path speed of 10 m/min. For the determination of permeation, the specimen was coated onto siliconized release paper and detached.

Results:
For the bonding-technological assessment of the examples mentioned above, firstly the bond strength, the SAFT test, tack and the test for flexibility were carried out.

TABLE 1

| | Bond strength [N/cm] Steel/PET/PE | SAFT [° C.] | Bending test |
|---|---|---|---|
| Example 1 | 10.7/9.5/7.4 | 120 | passed |
| Example 2 | 4.2/3.9/3.6 | 110 | passed |
| Example 3 | 7.3/6.2/5.7 | 98 | passed |
| Example 4 | 6.5/6.3/5.7 | 105 | passed |
| C1 | 9.5/5.5/4.2 | 145 | passed |
| C2 | 5.5/3.5/0.9 | 75 | passed |
| C3 | 5.5/5.7/3.9 | 87 | passed |
| C4 | — | — | failed |

As can be discerned, in examples 1 to 4 it was possible to achieve high bond strengths similar on all substrates and good resistances at elevated temperatures which are at least comparable with or better than pressure-sensitive adhesive compositions based on a different chemical structure (C1 to C3). The comparison with C4 reveals the high flexibility of the pressure-sensitive adhesive compositions with respect to highly crosslinking epoxides.

The results of the permeation and transmission measurements can be found in table 2.

TABLE 2

| | WVTR g/(m²*day) | OTR g/(m²*day*bar) | Transmission [%] |
|---|---|---|---|
| Example 1 | 42 | 4230 | 89 |
| Example 2 | 89 | 7280 | 88 |
| Example 3 | 33 | 8500 | 91 |
| Example 4 | 53 | 6900 | 87 |
| C1 | 320 | 40250 | 90 |
| C2 | >1000 | 62000 | 92 |
| C3 | >1000 | 75000 | 93 |
| C4 | 27 | 35 | 93 |

As can be discerned, the permeability of the pressure-sensitive adhesive compositions from example 1 to example 4 in comparison with C1 to C3 is very much lower and the transmission in the visible light range is similar. The water vapour permeability of the crosslinked epoxide and of the block copolymers is similar, and the oxygen permeability is higher in the case of the block copolymers. The transmission lies in a similar range for all the examples.

Results of the Lifetime Test:

TABLE 3

| | Lifetime [h] |
|---|---|
| Example 3 | 320 |
| C2 | 22 |
| C3 | 12 |

The lifetime tests clearly show, in comparison with other pressure-sensitive adhesive compositions, the very much better barrier effect and the resultant lengthening of the lifetime of the measurement construction.

The invention claimed is:
1. Method for encapsulating an electronic arrangement against permeants, the method comprising:
providing a pressure-sensitive adhesive composition comprised of vinylaromatic block copolymers and at least one resin having a softening point of 100° C. or more, wherein the pressure-sensitive adhesive composition exhibits a combination of adhesive and cohesive properties such that the pressure-sensitive adhesive composition constantly exhibits permanent tack and flexibility, wherein the block copolymers contain polymer blocks formed by vinylaromatics, wherein the block copolymers contain polymer blocks formed by polymerization of 1,3-dienes that are partially, selectively or fully hydrogenated polymer blocks, wherein the at least one resin is a hydrogenated hydrocarbon resin having a degree of hydrogenation of at least 90%, a DACP value of more than 30° C. and a MMAP value of more than

50° C., and further wherein the pressure-sensitive adhesive composition has a WVTR of less than 100 g/m²·d; and applying the pressure-sensitive adhesive composition onto and/or around regions of the electronic arrangement that are to be encapsulated.

2. Method according to claim 1, wherein the pressure-sensitive adhesive composition is provided in the form of an adhesive tape.

3. Method according to claim 1 wherein the pressure-sensitive adhesive composition is crosslinked after application on the electronic arrangement.

4. Method according to claim 1, wherein the application of the pressure-sensitive adhesive composition is effected without a subsequent thermal process step or irradiation.

5. Method of claim 1, wherein the pressure-sensitive adhesive composition contains polymer blocks formed by polymerization of butadiene and/or isoprene.

6. Method according to claim 5, wherein the block copolymers have a polyvinylaromatic fraction of 10% by weight to 35% by weight.

7. Method according to claim 5, wherein the pressure-sensitive adhesive composition has a fraction of the vinylaromatic block copolymers of at least 35% by weight, and the pressure-sensitive adhesive composition has a fraction of the vinylaromatic block copolymers of at most 80% by weight.

8. Method according to claim 1, wherein the hydrogenated hydrocarbon resin is based on hydrogenated polymers of dicyclopentadiene and has a degree of hydrogenation of at least 95%, a DACP value of more than 37° C. and a MMAP value of more than 60° C.

9. Method according to claim 1, wherein the at least one resin is selected from the group consisting of non-hydrogenated, partially hydrogenated or fully hydrogenated resins based on rosin and rosin derivatives, hydrogenated polymers of dicyclopentadiene, non-hydrogenated or partially, selectively or fully hydrogenated hydrocarbon resins based on C5, C5-C9 or C9 monomer streams, polyterpene resins based on α-pinene and/or β-pinene and/or δ-limonene, and hydrogenated polymers of pure C8 and C9 aromatics.

10. Method according to claim 5, wherein the pressure-sensitive adhesive composition contains one or more additives selected from the group consisting of plasticizers, primary antioxidants, secondary antioxidants, process stabilizers, light stabilizers, processing assistants, end block reinforcer resins and polymers.

11. Method according to claim 5, wherein the pressure-sensitive adhesive composition contains one or more nanoscale fillers, transparent fillers and/or getter and/or scavenger fillers.

12. Method according to claim 11, wherein the fillers are embodied in nanoscale fashion in at least one dimension.

13. Method according to claim 11 the pressure-sensitive adhesive composition has a fraction of the fillers of at least 5% by weight and/or has a fraction of the fillers of at most 95% by weight.

14. Method according to claim 5, wherein the pressure-sensitive adhesive composition has an average transmittance of at least 75% in the wavelength range of 400 nm to 800 nm.

15. Method according to claim 5, wherein the pressure-sensitive adhesive composition is embodied in UV-blocking fashion in the wavelength range of 190 nm to 400 nm, where an average transmittance of at most 20% is designated as UV-blocking.

16. Method according to claim 5, wherein the pressure-sensitive adhesive composition, after crosslinking, has an elongation at break of at least 20%.

17. Method according to claim 5, wherein the pressure-sensitive adhesive composition has an OTR of less than 10 000 g/m²·d·bar.

18. Method according to claim 5, wherein the pressure-sensitive adhesive composition is embodied as a carrier-free adhesive tape.

19. Method according to claim 2, wherein the layer thickness of the pressure-sensitive adhesive composition in the adhesive tape is at least 1 μm—and/or the layer thickness of the pressure-sensitive adhesive composition in the adhesive tape is at most 150 μm.

20. Method according to claim 1, wherein epoxidized vinylaromatic block copolymers are excluded from the vinylaromatic block copolymers of the pressure-sensitive adhesive composition.

21. Method for encapsulating an electronic arrangement against permeants, the method comprising:

providing a pressure-sensitive adhesive composition comprised of vinylaromatic block copolymers, wherein the pressure-sensitive adhesive composition contains a resin or a resin mixture, wherein the pressure-sensitive adhesive composition contains at least one resin, having a softening point of 100° C. or more, that provides a permeation barrier against oxygen, wherein the block copolymers contain polymer blocks formed by vinylaromatics, wherein the block copolymers contain polymer blocks formed by polymerization of 1,3-dienes that are partially, selectively or fully hydrogenated polymer blocks, wherein the at least one resin is a hydrogenated hydrocarbon resin having a degree of hydrogenation of at least 90%, a DACP value of more than 30° C. and a MMAP value of more than 50° C., and further wherein the pressure-sensitive adhesive composition has a WVTR of less than 100 g/m²·d; and applying the pressure-sensitive adhesive composition onto and/or around regions of the electronic arrangement that are to be encapsulated.

22. Method for encapsulating an electronic arrangement against permeants, the method comprising:

providing a pressure-sensitive adhesive composition comprised of vinylaromatic block copolymers and at least one resin having a DACP value of more than 30° C. and a MMAP value of more than 50° C., wherein the pressure-sensitive adhesive composition exhibits a combination of adhesive and cohesive properties such that the pressure-sensitive adhesive composition constantly exhibits permanent tack and flexibility, wherein the block copolymers contain polymer blocks formed by vinylaromatics, wherein the block copolymers contain polymer blocks formed by polymerization of 1,3-dienes that are partially, selectively or fully hydrogenated polymer blocks, wherein the at least one resin is a hydrogenated hydrocarbon resin having a degree of hydrogenation of at least 90%, and further wherein the pressure-sensitive adhesive composition has a WVTR of less than 100 g/m²·d; and applying the pressure-sensitive adhesive composition onto and/or around regions of the electronic arrangement that are to be encapsulated.

* * * * *